United States Patent [19]

Tantraporn

[11] 4,336,099
[45] Jun. 22, 1982

[54] METHOD FOR PRODUCING GALLIUM ARSENIDE SINGLE CRYSTAL RIBBONS

[75] Inventor: Wirojana Tantraporn, Schenectady, N.Y.

[73] Assignee: General Electric Company, Schenectady, N.Y.

[21] Appl. No.: 241,280

[22] Filed: Mar. 6, 1981

Related U.S. Application Data

[63] Continuation of Ser. No. 94,099, Nov. 14, 1979, abandoned.

[51] Int. Cl.³ .................... C30B 25/04; C30B 29/42
[52] U.S. Cl. ............................ 156/614; 156/617 R; 156/606; 156/DIG. 70; 156/DIG. 88; 156/DIG. 96
[58] Field of Search ............... 156/DIG. 70, DIG. 81, 156/DIG. 88, DIG. 89, DIG. 96, 606, 617 R, 610, 613, 614, 608; 422/245, 246; 148/175, 187

[56] References Cited

U.S. PATENT DOCUMENTS

| | | | |
|---|---|---|---|
| 3,354,007 | 11/1967 | Michelitsch | 148/187 |
| 3,386,866 | 6/1968 | Ebert et al. | 156/614 |
| 3,425,879 | 2/1969 | Shaw et al. | 148/175 |
| 3,471,324 | 10/1969 | Wilson et al. | 156/614 |
| 3,758,387 | 9/1973 | Zwicker et al. | 148/187 |
| 3,884,733 | 5/1975 | Bean | 148/175 |

FOREIGN PATENT DOCUMENTS

| | | | |
|---|---|---|---|
| 860284 | 1/1971 | Canada | |
| 47-10174 | 3/1972 | Japan | 156/610 |

OTHER PUBLICATIONS

Ito et al, "Morphological Studies of GaAs", published in J. of Crystal Growth, vol. 13, #14, pp. 336-341, Mar. 1972.
Tausch, Jr. et al, "A Novel Crystal Growth", published in J. of Electrochemical Soc., vol. 112, #7, Jul. 1965, pp. 706-709.
Tantraporn, "Flexible GaAs Ribbons", published in Applied Phys. Lett. #35 (6), Sep. 1979, pp. 449-451.
DiLorenzo, "Vapor Growth of Epitaxial GaAs", published in J. of Crystal Growth, vol. 17, Jul. 1972, pp. 189-206.

*Primary Examiner*—Gregory N. Clements
*Attorney, Agent, or Firm*—Donald R. Campbell; James C. Davis, Jr.; Marvin Snyder

[57] ABSTRACT

The single crystal growth of GaAs is highly anisotropic under certain conditions. A wafer of GaAs is masked and exposed to the vapor only through a long, narrow slot in the <110> direction. A thin ribbon of single crystal GaAs grows out of the slot at a high rate along the <11$\bar{2}$> vector and has {111} plane major faces and {110} plane edges. This ribbon is flexible. A $H_2$-$AsCl_3$-Ga epitaxy system is modified to permit retraction of the ribbon as it grows and thus the production of long ribbons.

3 Claims, 5 Drawing Figures

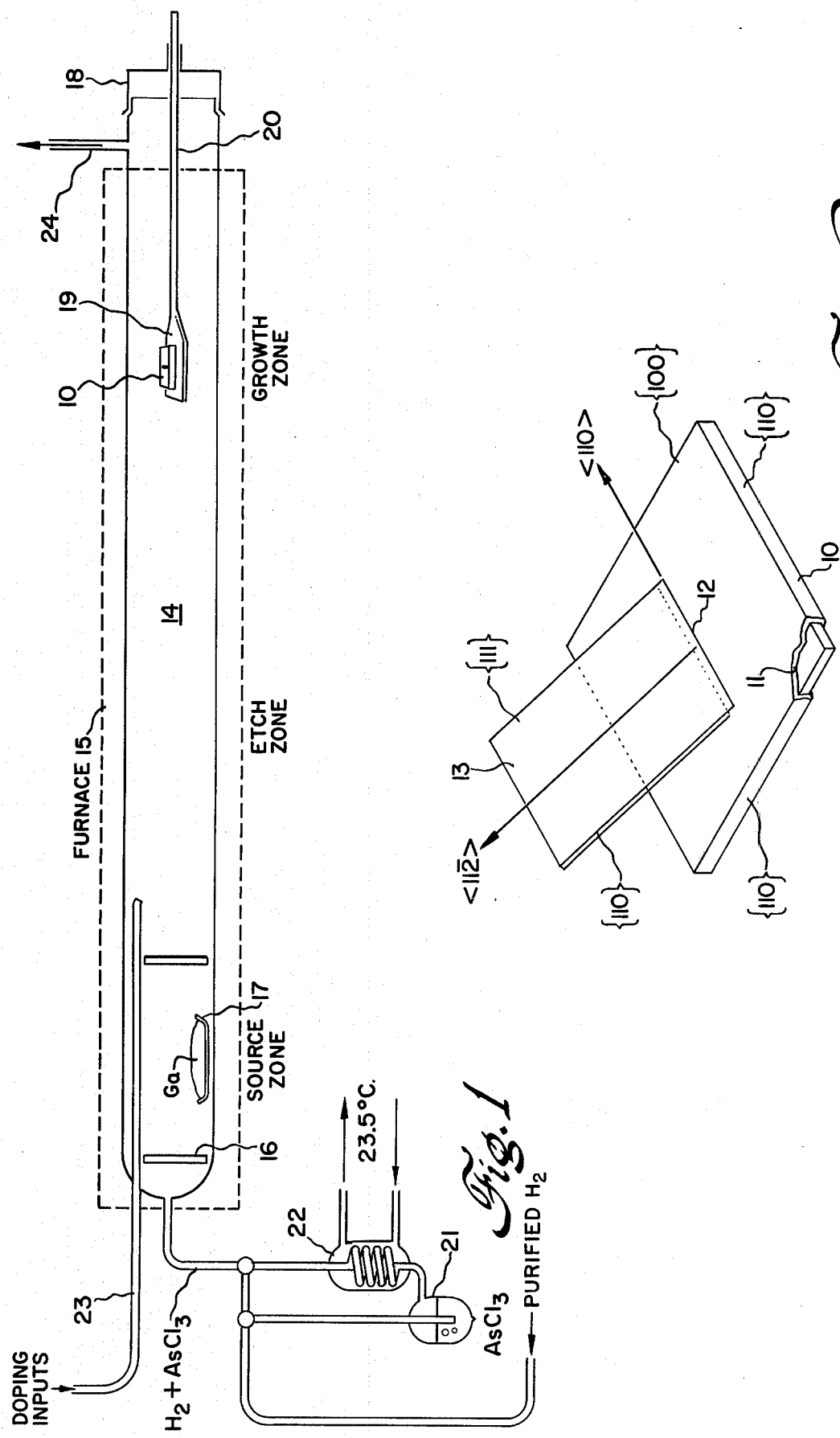

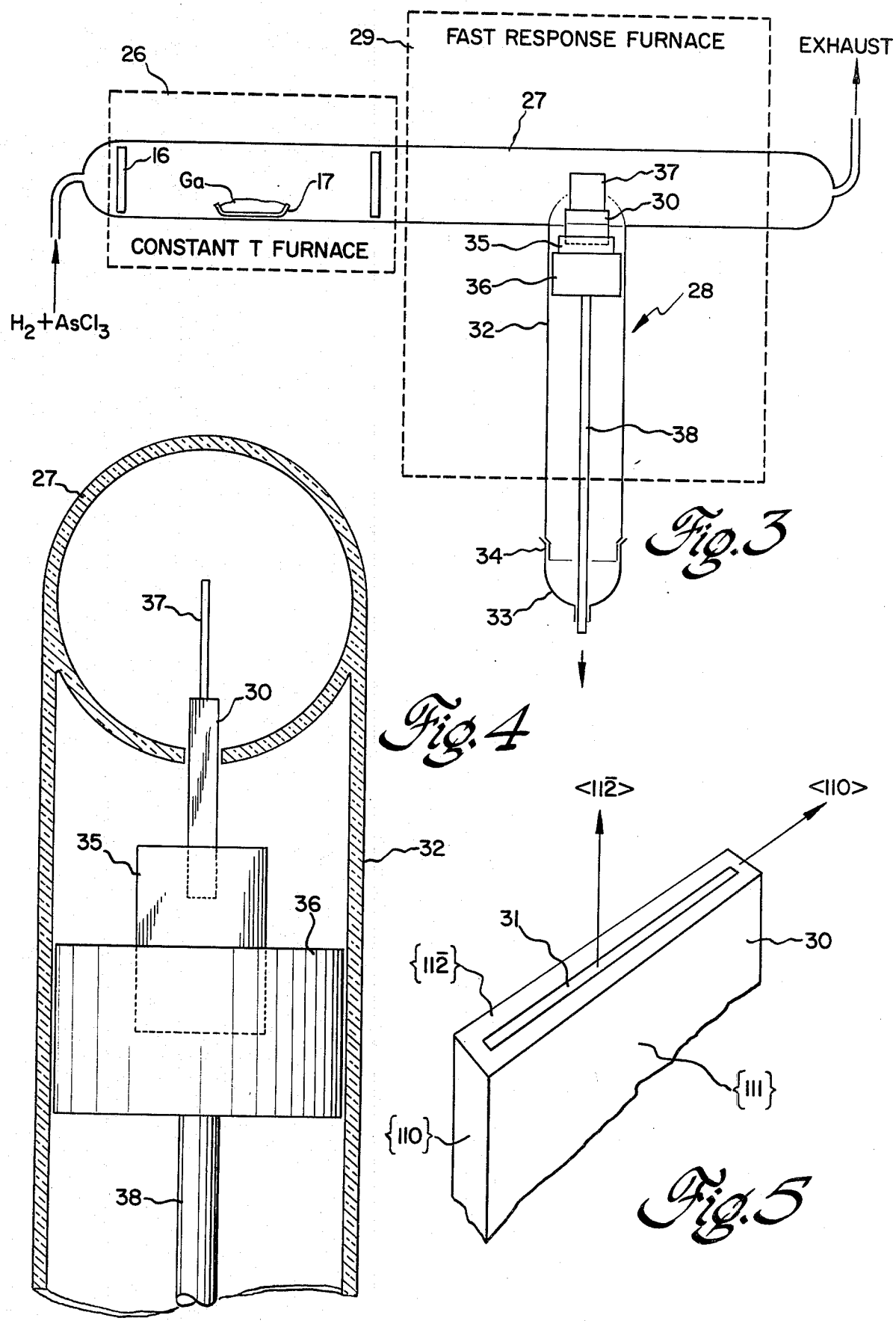

METHOD FOR PRODUCING GALLIUM ARSENIDE SINGLE CRYSTAL RIBBONS

This application is a continuation, of application Ser. No. 094,099, filed Nov. 14, 1979, abandoned.

BACKGROUND OF THE INVENTION

This invention relates to the fabrication of semiconductor substrate material and more particularly to the preparation of single crystal gallium arsenide ribbon directly from the component sources.

Gallium arsenide substrates for various applications including solar cells are normally obtained by cutting the single crystal boule into wafers which are polished. The high cost of synthesizing GaAs from Ga and As, in terms of the furnace energy and containers, growing the boule, and producing the wafers by x-ray orientation, slicing and polishing, and the material lost along the processing, combine to make the GaAs devices economically impractical. Also, it is difficult to grow single crystals of sufficiently large size or with reproducible uniformity. A substrate of large area is in general of poor crystal quality. It is, therefore, desirable to devise a process for producing GaAs substrates in thin single crystal form, such as ribbons, directly from the component sources, and that these substrates be minimally defective so that breakage does not easily occur.

SUMMARY OF THE INVENTION

The anisotropic nature of gallium arsenide crystal growth and the continuous nature of the vapor pressure chemical reaction system are utilized to provide thin ribbon gallium arsenide single crystal of essentially endless length. These thin ribbons are flexible, contrary to the brittle character of single crystal gallium of greater thicknesses. A ribbon growth rate of greater than 1 inch/hour has been established, high enough for thin sheet production.

A wafer of monocrystalline GaAs is masked with an insulating layer which has a long narrow slot along the $<110>$ crystallographic direction. In the vapor phase epitaxy system, the masked wafer is heated to an elevated temperature and gallium and arsenic atoms are carried in a gas stream to the exposed wafer surface. A thin ribbon single crystal GaAs grows out of the slot at a very high rate along the $<11\bar{2}>$ crystallographic vector. The ribbon growth has a width approximately equal to the length of the slot and the thickness is approximately the slot width, but the length is limited only by the available space and/or chemical vapor volume. The major surfaces or faces of the ribbon are $\{111\}$ planes and the long edges are $\{110\}$ planes. One set of growth conditions in a H$_2$-AsCl$_3$-Ga epitaxy system are given. An auxiliary doping input can be provided to produce p-type or n-type GaAs ribbon. The preferred embodiment of this vapor phase system has a sample retracting branch which intersects the main growth tube and permits the wafer and growing ribbon to be withdrawn out of the gas stream at the ribbon growth speed until a designated ribbon length is grown. For growth vertical to the surface, the wafer has $\{111\}$ plane major surfaces and the slot is opened upon a $\{11\bar{2}\}$ plane edge.

The large size and good mechanical durability of thin GaAs single crystal ribbons produced by these methods are such that the crystals can be cut to appropriate dimensions for device applications such as GaAs integrated circuits and GaAs-base solar cells.

BRIEF DESCRIPTION OF THE DRAWINGS

FIG. 1 shows one embodiment of a vapor phase epitaxy system for fabricating thin gallium arsenide ribbons;

FIG. 2 is a perspective view of a $\{100\}$ plane GaAs wafer and a grown single crystal ribbon;

FIG. 3 is a diagram of a preferred embodiment of the H$_2$-AsCl$_3$-Ga epitaxy system which has provision for ribbon retraction;

FIG. 4 is an enlarged cross section through the growth tube and part of the sample loading and retracting branch in FIG. 3; and FIG. 5 is a perspective view of the preferred $\{111\}$-surface wafer for vertical ribbon growth.

DESCRIPTION OF THE PREFERRED EMBODIMENTS

Referring to FIGS. 1 and 2, the H$_2$-AsCl$_3$-Ga vapor epitaxy system, when operated under certain conditions, produces thin single crystal gallium arsenide ribbons. These ribbons have the practical property that they are not brittle. Although some ribbons are obtained from unintentional seeding, the ribbons can be produced in a more controlled manner. A wafer 10 of monocrystalline gallium arsenide is completely covered with a thin insulating layer 11 such as approximately 2000 Å of silicon dioxide film. A long, narrow slot 12 whose axis is along the $<110>$ crystallographic direction is opened up on one major surface. Upon being placed in the vapor phase epitaxy system, ribbon growth is found to be limited by the mask opening and the growth tube diameter. A thin ribbon 13 of single crystal gallium arsenide grows out of slot 12 at a very high rate along the $<11\bar{2}>$ crystallographic vector, and is bounded by $\{111\}$ planes which are the ribbon wide surfaces, while the thin edges of the ribbon are bounded by $\{110\}$ planes. The ribbon width and thickness are approximately equal to the length and width of slot 12. Because of the very rapid growth rate along the ribbon length in the $<11\bar{2}>$ direction, the growth in the directions of the flat wide surfaces and the thin edges are negligible, and the ribbon maintains virtually constant cross section.

The H$_2$-AsCl$_3$-Ga epitaxy system is conventional and is discussed only as to its major features and the set of run conditions that have actually produced ribbon growth. A relatively long quartz growth tube 14 is surrounded over most of its length by a furnace 15 which has three separate heating regions. The system features long zones of constant temperatures along the horizontal flow direction known as the source zone, the etch zone, and the growth zone. In the source zone, between two flow baffles 16, is a quartz boat 17 filled with liquid gallium. A removable end piece 18 has a ground glass joint with the other end of the growth tube and permits sample loading and removal; a substrate holder and push rod are indicated at 19 and 20. Wafer 10 is masked such that the gallium arsenide surface is exposed to the gas stream only through a slot a few microns wide in the appropriate direction.

A mixture of hydrogen and arsenic trichloride is admitted to the source chamber, and the mole faction of AsCl$_3$ in the gas stream is controlled by a condenser. Purified H$_2$ is fed to a bubbler 21 containing liquid AsCl$_3$, and the vapor mixture passes through a condenser 22 before being introduced into the growth tube. An auxiliary or doping input conduit 23 passes through the source zone and exits into the etch zone. Sample 10 is initially placed into the middle zone to thoroughly clean the exposed wafer surface and is then moved into the growth zone. Ga and As atoms, together with dopant atoms such as sulfur or zinc if provided, are carried in the gas stream and form GaAs epitaxial crystal on the substrate within the slotted opening. The exhaust is through outlet tube 24.

Single crystal GaAs ribbon was found for the following prescribed conditions of the $H_2$-$AsCl_3$-Ga vapor phase system. The furnace temperature for the source zone was 860° C., for the etch zone was 873° C., and for the growth zone was 759° C. The resistively heated furnace 15 was 40 inches long, and the inner diameter of growth tube 14 was 30 millimeters. The main flow rate of $H_2$+$AsCl_3$ was 212 cm$^3$/min with the $AsCl_3$ mole fraction controlled by a 23.5° C. condenser. The sample was placed in the etch zone for 7 minutes prior to its placement in the deposition zone. A growth rate larger than 1 in/hr along the length when the ribbon cross section is approximately 0.1×0.002 cm$^2$ was established in this epitaxy system. Continuous growth of the ribbon in the $<11\bar{2}>$ direction ceased when the newly grown tip of the ribbon touched the inside of growth tube 14 and was deformed.

The width of mask slot opening 12 and thus the thickness of GaAs ribbon 13 should not exceed 1 mil or 25 microns and is preferably considerably less. Ribbon thicknesses of greater than 1 mil are not flexible, and a large wafer of this greater thickness tends to break apart. Thin single crystal GaAs ribbons are flexible and can be bent to a 1 cm curvature; often the substrate can be swung as a pendulum supported by the ribbon. Ribbon growth from two slits is possible if there is sufficient growth material in the gas stream to support two slits.

FIGS. 3–5 relate to an embodiment of a production scheme in which the crystal is withdrawn at the ribbon growth speed and hence the growth is "open-ended" in principle. This is the preferred embodiment of the $H_2$-$AsCl_3$-Ga vapor phase epitaxy system and is referred to as a growth tube with ribbon retractor. The front end of the apparatus is identical to FIG. 1 and a constant temperature furnace 26 is provided to heat the source zone. At the other end, the etch and growth zones are combined and main growth tube 27 has an intersecting sample loading and retracting branch 28 which is at right angles to the main tube. A fast response furnace 29 for this entire assembly is initially set at the etching temperature and after a short time is turned down to a somewhat lower temperature for ribbon growth.

Monocrystalline GaAs wafer 30 has {111} plane major faces and {11$\bar{2}$} plane edges. Elongated slot 31 in the silicon dioxide mask, which otherwise completely covers all six surfaces of the sample, is placed on the substrate's edge and is thus along the <110> direction as is required. The $<11\bar{2}>$ direction of rapid single crystal ribbon growth is then perpendicular to the exposed wafer surface and the ribbon grows straight up rather than at a slant as in FIG. 2. It is readily seen that the requirements are satisfied that the GaAs ribbon has {111} planes on the major faces and {110} planes on the thin edges. Branch tube 32 is slightly longer than the desired ribbon length and is connected to removable end pieces 33 via ground glass joint 34. The GaAs substrate 30 is clamped in upright position by sample holder 35 which is guided for movement along the axis of branch tube 32 by a quartz piston guide 36. There is vertical growth of single crystal GaAs ribbon 37 and its tip or region of new growth is maintained in the gas stream by retracting push rod 38 and the parts between it and the ribbon at the ribbon growth speed. Thus, the region of new epitaxial growth is always in the gas stream and the epitaxial growth is continuous until the designated ribbon length is reached and the gas stream is turned off. After waiting for the furnace to cool, the apparatus is disassembled and the wafer and grown ribbon are removed.

In conclusion, the anisotropic character of crystal growth and recognition that there is a unique direction of the high growth rate, and the continuous nature of the vapor phase chemical reaction system, are utilized to provide thin ribbon GaAs single crystal of essentially endless length. The flexible ribbons have many applications as GaAs substrates for electronic devices such as GaAs-base solar cells and GaAs integrated circuits. For additional information, refer to "Flexible GaAs Ribbons" by the inventor, Applied Physics Letters, Vol. 35, No. 6, Sept. 15, 1979, pages 449–451, the disclosure of which is incorporated herein by reference.

While the invention has been particularly shown and described with reference to preferred embodiments thereof, it will be understood by those skilled in the art that various changes in form and details may be made therein without departing from the spirit and scope of the invention.

The invention claimed is:

1. A method of producing gallium arsenide single crystal ribbon comprising the steps of:
    masking a wafer of monocrystalline gallium arsenide with an insulating layer which has an elongated slot in the <110> crystallographic direction;
    placing said wafer in a $H_2$-$AsCl_3$-Ga vapor phase epitaxy system in which it is heated and gallium and arsenic atoms are carried in a gas stream to the exposed heated wafer under prescribed conditions to epitaxially grow out of said slot in the $<11\bar{2}>$ direction, which is the ribbon length direction, a thin flexible ribbon of single crystal gallium arsenide having a thickness and width approximately equal to the dimensions of said slot and having {111} plane major surfaces and {110} plane long edges, said ribbon continuing to grow in said gas stream at a high growth rate along the ribbon length and having negligible growth in the directions of said major surfaces and long edges so that the ribbon cross section is substantially constant throughout; and
    retracting said wafer and thin flexible ribbon at the ribbon growth speed to maintain the region of new growth in said gas stream until a designated ribbon length is reached and said gas stream is turned off.

2. The method of claim 1 wherein the ribbon growth rate exceeds 1 inch/hour.

3. A method of producing gallium arsenide single crystal ribbon comprising the steps of:
    masking a wafer of monocrystalline gallium arsenide with an insulating layer which has an elongated slot in the <110> crystallographic direction;
    placing said masked wafer in a vapor phase epitaxy system in which it is heated and gallium and arsenic atoms are carried in a gas stream to the exposed heated wafer surface under prescribed conditions to epitaxially grow out of said slot in the $<11\bar{2}>$ direction a thin flexible ribbon of single crystal gallium arsenide having a thickness and width approximately equal to the dimensions of said slot, said ribbon having {111} plane major surfaces and {110} plane long edges and continuing to grow until a designated ribbon length is reached and said gas stream is turned off; and removing the wafer and grown ribbon from said vapor phase epitaxy system;

wherein said vapor phase epitaxy system is a $H_2$-AsCl$_3$-Ga system having a main growth tube and an intersecting sample loading and retraction branch, and wherein said wafer and thin single crystal ribbon are withdrawn out of the main growth tube and gas stream into said retraction branch at the ribbon growth speed.

* * * * *